(12) United States Patent
Müller

(10) Patent No.: US 6,365,525 B2
(45) Date of Patent: Apr. 2, 2002

(54) METHOD OF FABRICATING A SEMICONDUCTOR INSULATION LAYER

(75) Inventor: Karlheinz Müller, Waldkraiburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/730,273

(22) Filed: Dec. 5, 2000

Related U.S. Application Data

(62) Division of application No. 09/376,946, filed on Aug. 18, 1999, now Pat. No. 6,207,517.

(30) Foreign Application Priority Data

Aug. 18, 1998 (DE) .......................................... 198 37 395

(51) Int. Cl.[7] .............................................. H01L 21/00
(52) U.S. Cl. .......................... 438/705; 216/62; 216/87; 438/723; 438/743; 438/756
(58) Field of Search ................................. 438/705, 723, 438/743, 756; 216/62, 79, 87, 99

(56) References Cited

U.S. PATENT DOCUMENTS

| | | | |
|---|---|---|---|
| 4,104,085 A | * | 8/1978 | Zandveld ................. 438/705 X |
| 4,450,041 A | * | 5/1984 | Akluff ..................... 438/705 X |
| 4,652,234 A | | 3/1987 | Jain et al. |
| 5,817,580 A | | 10/1998 | Violette |

FOREIGN PATENT DOCUMENTS

| | | |
|---|---|---|
| DE | 25 54 638 A1 | 6/1977 |
| EP | 0 706 202 A2 | 4/1996 |
| EP | 0 712 152 A1 | 5/1996 |
| EP | 0 777 269 A2 | 6/1997 |
| EP | 0 148 448 A2 | 7/1999 |
| GB | 1551290 | 8/1979 |
| JP | 10-12589 | 1/1998 |
| TW | 241 376 | 2/1995 |

OTHER PUBLICATIONS

International Publication No. WO 97/03462 (Schwalke et al.), dated Jan. 30, 1997.

* cited by examiner

*Primary Examiner*—William A. Powell
(74) *Attorney, Agent, or Firm*—Herbert L. Lerner; Laurence A. Greenberg; Werner H. Stemer

(57) ABSTRACT

The invention defines a method for fabricating a semiconductor insulation layer: A semiconductor substrate is first provided; an insulation layer is applied by way of region-by-region or whole-area application to the semiconductor substrate; impurity ions are selectively implanted into at least one predetermined zone of the insulation layer; then the insulation layer is selectively etched, and the insulation layer is thereby patterned in accordance with the zone or zones of the selectively implanted impurity ions.

14 Claims, 5 Drawing Sheets

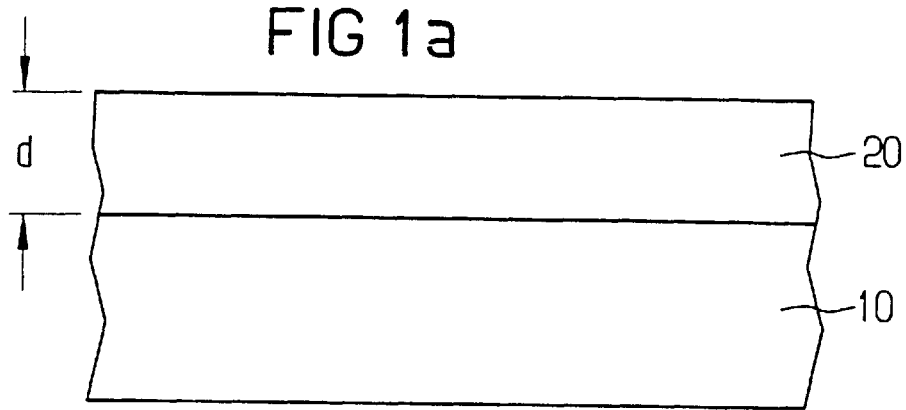
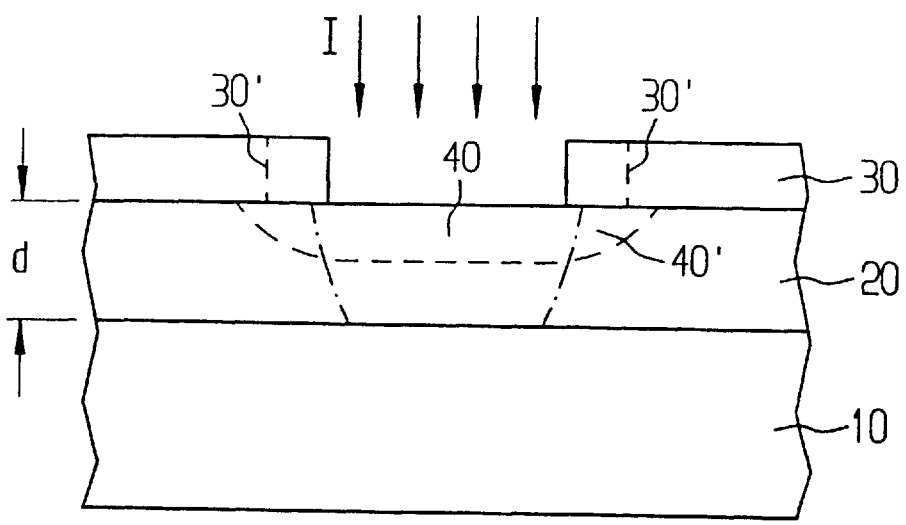
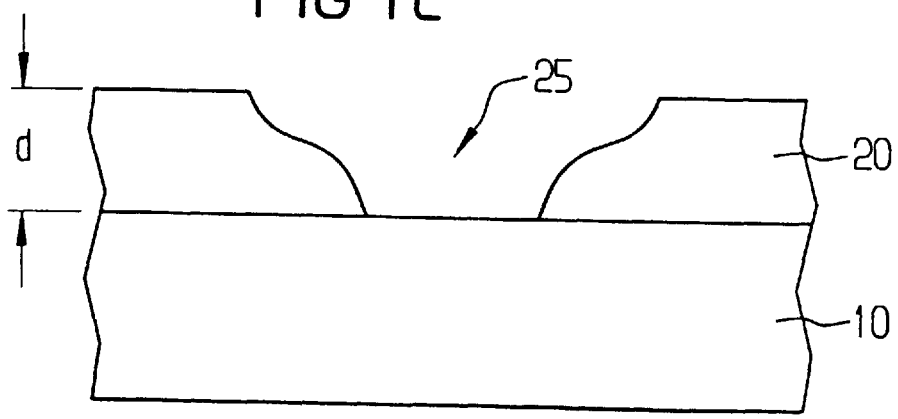

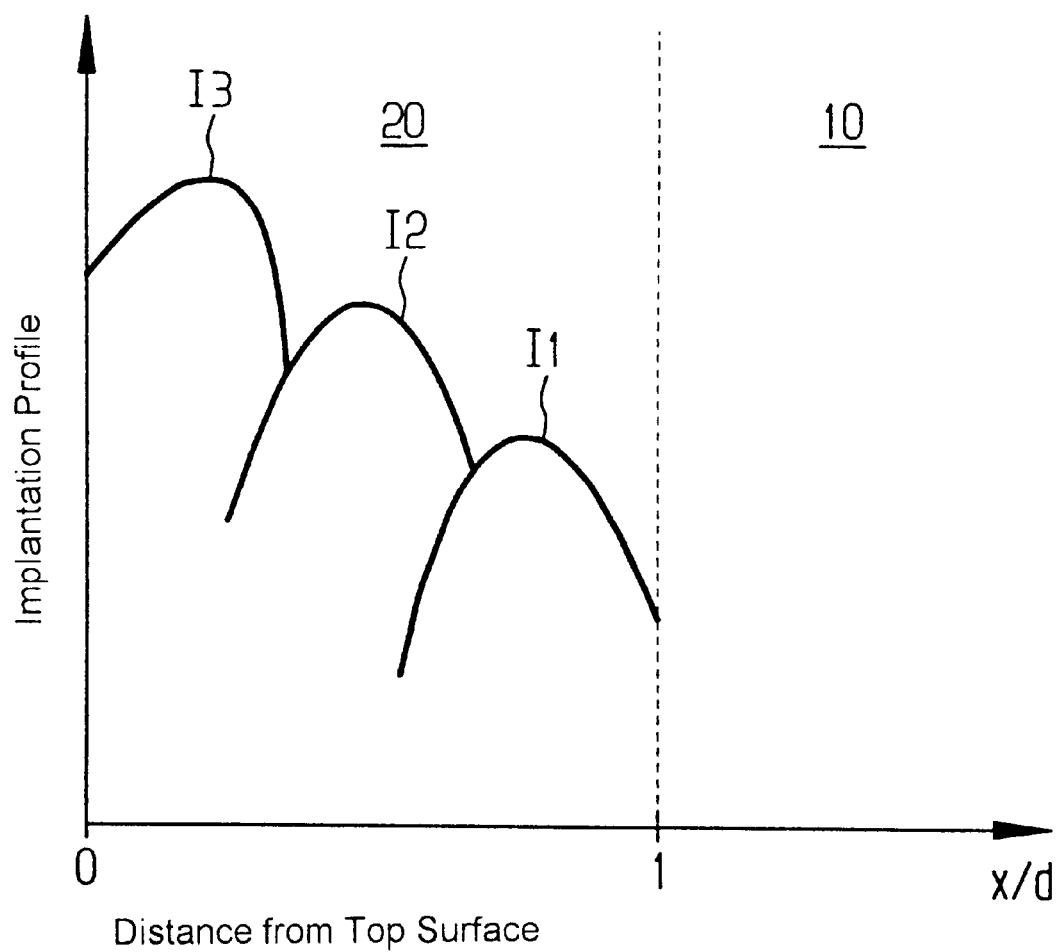

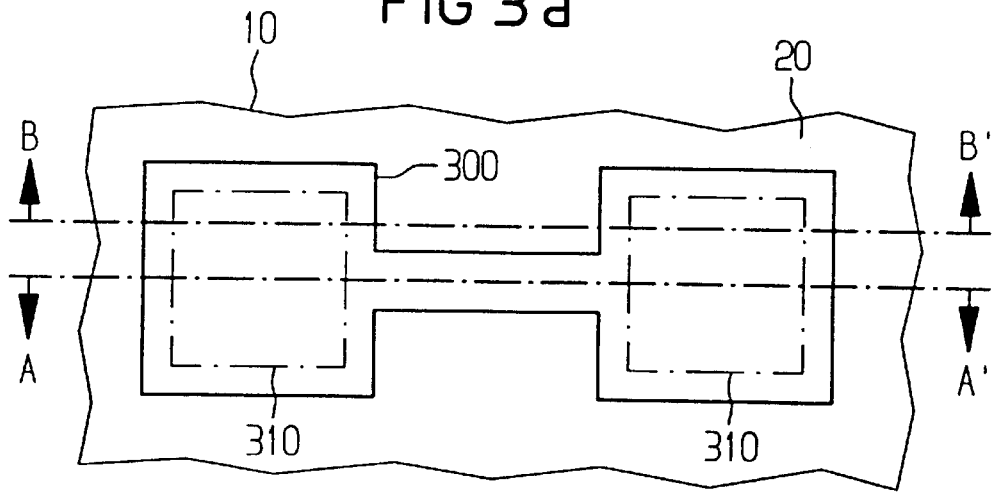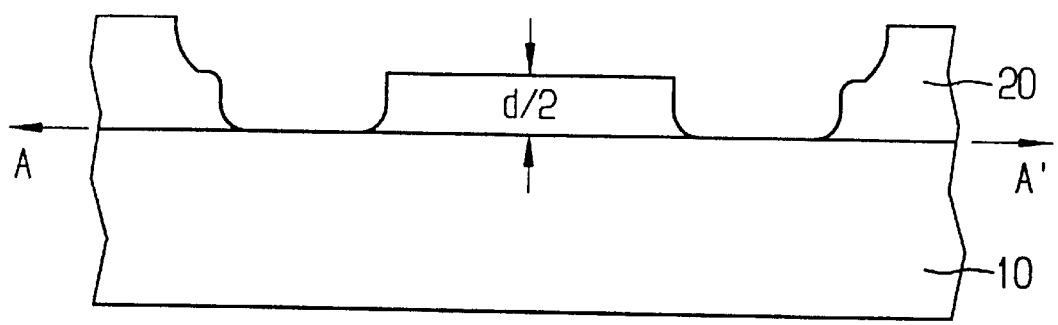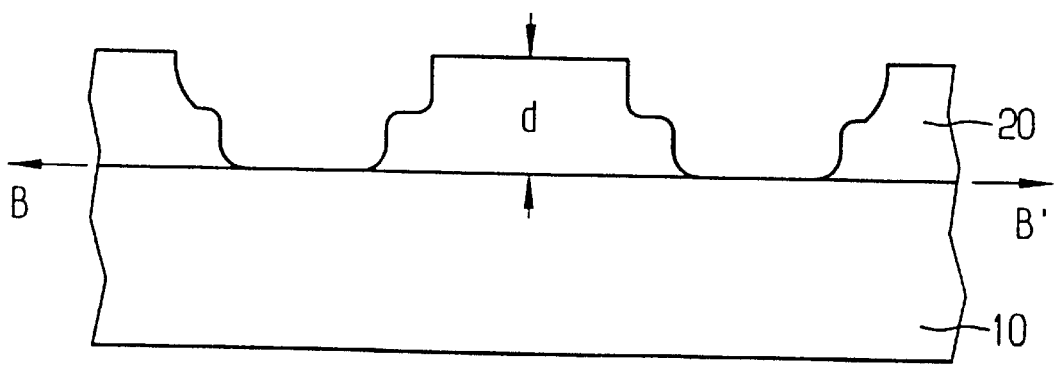

METHOD OF FABRICATING A SEMICONDUCTOR INSULATION LAYER

CROSS-REFERENCE TO RELATED APPLICATION

This application is a division of U.S. application Ser. No. 09/376,946, filed Aug. 18, 1999, now U.S. Pat. No. 6,207,517.

BACKGROUND OF THE INVENTION

FIELD OF THE INVENTION

The invention lies in the field of semiconductor technology. More specifically, the present invention relates to a method for fabricating a semiconductor insulation layer.

In state of the art technology, insulation layers on substrates in semiconductor components are fabricated by an extensive array of different technologies. Two examples thereof are the LOCOS technology and the STI (Shallow Trench Isolation) technology. In this context, the term substrate should be understood to mean any support, and not merely a wafer substrate. A substrate, as meant herein, may therefore be a wafer substrate, an epitaxial structure, a well in a wafer substrate, a circuit in a wafer substrate, etc.

A disadvantageous fact that has come to light in the case of the prior art approaches noted above is that they require a high process outlay and the insulation layer is frequently susceptible to shear tension and stress within itself and with respect to the substrate; the latter applies in particular to LOCOS technology.

SUMMARY OF THE INVENTION

It is accordingly an object of the invention to provide a method for fabricating a semiconductor insulation layer, which overcomes the above-mentioned disadvantages of the heretofore-known devices and methods of this general type and which makes it possible to create stress-free, stable insulation with a comparatively low process outlay.

With the foregoing and other objects in view there is provided, in accordance with the invention, a method of fabricating a semiconductor insulation layer, which comprises the following steps:

providing a semiconductor substrate;

forming (region-by-region or whole-area layer formation) an insulation layer on the semiconductor substrate; selectively implanting impurity ions into a predetermined zone of the insulation layer; and selectively etching the insulation layer and patterning the insulation layer in correspondence with the predetermined zone selectively implanted impurity ions.

By contrast with the prior art approaches, the method according to the invention has the advantage that it enables an insulation structure without tensions in a simple and cost-effective process.

The basic premise on which the present invention is founded includes the patterning of the insulation layer in accordance with zones of selectively implanted impurity ions by means of selective etching of an insulation layer on a semiconductor substrate.

In accordance with an added feature of the invention, the substrate is a silicon semiconductor substrate and the insulation layer formed on the substrate is a silicon dioxide layer. Preferably, the insulation layer is a thermal oxide layer. The silicon semiconductor substrate is the most usual case. It should be noted, however, that the present invention is in no way restricted to this, rather other semiconductor materials can readily be used. Thermal oxide layers exhibit particularly good connection to the substrate.

In accordance with an additional feature of the invention, a layer of thermal oxide is formed on the semiconductor substrate and a layer of non-thermal oxide on the layer of thermal oxide. In a preferred embodiment, the non-thermal oxide is a TEOS or LTO (low temperature oxide), applied over the layer of thermal oxide. Such an oxide not only provides a good connection to the substrate but can also be applied with high deposition rates.

In accordance with another feature of the invention, the selective implantation is carried out using at least one mask, in particular a photoresist mask. This is the customary way of patterning in the case of wet and dry etching, but it goes without saying that other masks, such as e.g. nitride masks, etc., can also be used.

In accordance with a further feature of the invention, the selective implantation is carried out at different angles and/or energies and/or doses. The etching zones can be accurately patterned in this way.

In accordance with a further preferred development, the selective implantation and etching are carried out in such a way that the insulation layer in the implanted zones is removed by the etching. This should be understood as a positive process and constitutes the preferred case in which the implanted ions weaken the bond structure.

In accordance with a further preferred development, the selective implantation and etching are carried out in such a way that the insulation layer in the implanted zones is not removed by the etching. This should be understood as a negative process and is somewhat more complicated in terms of process engineering since, as a rule, an additional high-temperature process is necessary in order to bind the incorporated ions stably into the bond structure.

In accordance with a further preferred development, the selective implantation and etching are carried out in such a way that a contact region is formed, which is continuous through the insulation layer as far as the semiconductor substrate and whose sidewalls are designed to be stepped, for example.

In accordance with again an added feature of the invention, at least one element selected from the group consisting of Ar, N, O, B, As, and P, is implanted and a concentration of the impurities defines an etching rate in the respective zone. This means, as a rule, that a high impurity concentration is equivalent to a high local etching rate.

With the above and other objects in view there is further provided, in accordance with the invention, a method of fabricating a semiconductor component with the semiconductor insulation layer according to the foregoing summary. The method comprises the following steps:

providing a semiconductor substrate;

forming a whole-area insulation layer on the semiconductor substrate with a predetermined thickness;

forming a first mask on the insulation layer and defining a first predetermined zone;

selectively implanting impurity ions into the first predetermined zone of the insulation layer defined by the first mask, and thereby selecting an implantation profile in accordance with an etching zone situated on the surface and having a smaller thickness than the predetermined thickness of the insulation layer;

selectively etching the insulation layer in the first predetermined zone in accordance with the mask;

forming a second mask on the semiconductor substrate and defining a second predetermined zone of the insulation layer;

selectively implanting impurity ions into the second predetermined zone of the insulation layer, and selecting an implantation profile in accordance with an etching zone having the same thickness as the thickness of the insulation layer;

selectively etching the insulation layer in the first predetermined zone and uncovering the semiconductor substrate;

forming a whole-area conductive layer on the structure formed in the selectively etching; and polishing the conductive layer substantially to the thickness of the insulation layer.

In other words, the novel method for fabricating the semiconductor component that contains the semiconductor insulation layer as defined above provides the following patterning of the insulation layer applied to the semiconductor substrate: formation of a first mask on the semiconductor substrate; selective implantation of impurity ions into a first predetermined zone in accordance with the first mask of the insulation layer, the implantation profile being selected in accordance with an etching zone situated on the surface and having a smaller thickness than the thickness of the insulation layer; selective etching of the insulation layer in the first predetermined zone in accordance with the mask; formation of a second mask on the semiconductor substrate; selective implantation of impurity ions into a second predetermined zone in accordance with the second mask of the insulation layer, the implantation profile being selected in accordance with an etching zone having the same thickness as the thickness of the insulation layer; selective etching of the insulation layer in the first predetermined zone in accordance with the mask for the purpose of uncovering the semiconductor substrate; whole-area application of a conductive layer to the resulting structure; and polishing, in particular chemical mechanical polishing, of the conductive layer to essentially the thickness of the insulation layer.

This procedure creates contact regions, thick insulation regions and thin insulation regions with, incorporated into the insulation layer, planarized interconnects of the conductive layer, which are connected to the substrate via the contact regions.

In accordance with a further preferred development, the conductive layer is patterned.

In accordance with a further preferred development, a field-effect transistor is formed with a channel well zone in the second predetermined zone in accordance with the second mask, a superior gate insulator layer and source and drain zones in the adjoining region of the semiconductor substrate.

In accordance with a further preferred development, the following are carried out: formation of the first mask on the semiconductor substrate in accordance with a dumbbell-shaped zone; formation of the second mask on the semiconductor substrate in accordance with a respective zone in the dumbbell plates of the dumbbell-shaped zone in accordance with the first mask; and formation of a respective field-effect transistor with a channel well zone in the respective zone in accordance with the second mask, a superior gate insulator layer and source and drain zones in the adjoining region of the semiconductor substrate; the conductive layer, which runs across the dumbbell web, connecting the two gate terminals of the field-effect transistors. In this way, it is possible to form a simple field-effect transistor inverter structure with a common gate terminal.

Other features which are considered as characteristic for the invention are set forth in the appended claims.

Although the invention is illustrated and described herein as embodied in a method for fabricating a semiconductor insulation layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1a–c are partial cross-sectional, diagrammatic views illustrating various process stages of a first embodiment of the method according to the invention;

FIG. 2 is a graph diagrammatically illustrating different implantation profiles for use in the method according to the invention;

FIG. 3a is a plan view onto a diagrammatic layout for a field effect transistor structure;

FIG. 3b is a section taken along the line A–A' in FIG. 3a;

FIG. 3c is a section taken along the line B–B' in FIG. 3a;

DESCRIPTION OF THE PREFERRED EMBODIMENTS

Figure 3D:
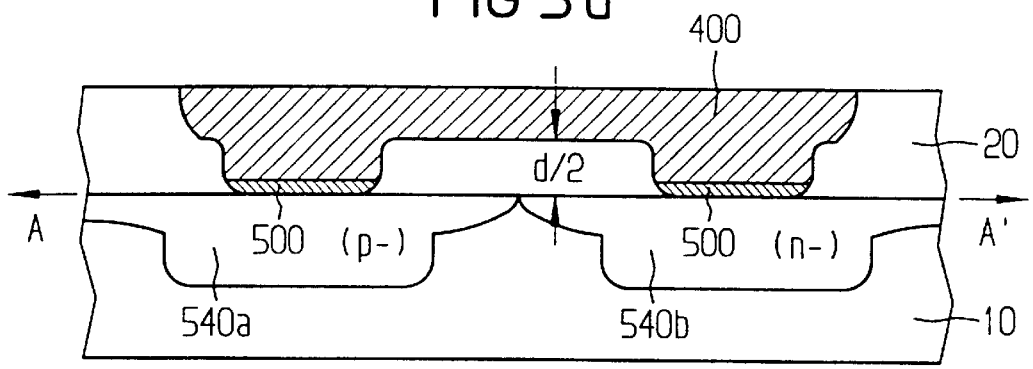
FIG. 3d is a section corresponding to FIG. 3b in a later process stadium.

Referring now to the FIGS. of the drawing in detail, it is first noted that identical reference symbols designate identical or functionally identical elements throughout.

FIGS. 1a–c relate to different process stages of a first embodiment of the method according to the invention, in section.

The various views of FIGS. 1a–c show a semiconductor substrate 10 made of silicon, an insulation layer 20 in the form of an oxide layer, a respective mask 30, 30' made of photoresist, and a respective implantation zone 40, 40' in accordance with the mask 30 and 30', respectively. The insulation layer 20 has a defined thickness d, and a contact region is formed at 25. In FIG. 1b and FIG. 2, the symbols and I, I1, I2, and I3 designate respective ion implantations.

First of all, as shown in FIG. 1a, the semiconductor substrate 10 is provided with the insulation layer 20 in the form of the oxide layer over the entire surface area. This is done by forming a thermal oxide or a sandwich made of thermal oxide as the lower layer and a layer of non-thermal oxide, in particular TEOS or LTO oxide, applied over the lower layer. Then, as shown in FIG. 1b, the first mask 30 made of photoresist is formed on the oxide layer 20. The first mask 30 defines a corresponding first implantation region 40. There follows a selective implantation I of impurities, for example boron, into the implantation region 40. The mask 30 is subsequently removed.

Afterwards, as shown in FIG. 1b, the second mask 30' made of photoresist is formed on the oxide layer 20. The second mask 30' defines a corresponding first implantation region 40'. There follows, in an analogous manner, a selective implantation I of impurities, for example boron, into the implantation region 40'. The mask 30' is subsequently removed.

The oxide layer 20 is then selectively etched, thereby producing patterning of the insulation layer 20 in accordance with the regions 40; 40' of the selectively implanted impurity ions. The etching is carried out wet-chemically or dry-chemically using an isotropic etching method, the oxide layer 20 in the implanted zones being removed by the etching since the implanted boron ions weaken the bond structure.

The structure shown in FIG. 1c is established as a result of the etching, the contact region 25 being formed in the structure. The contact region is continuous through the oxide layer 20 as far as the semiconductor substrate 10 and the side walls of the contact region are stepped (two steps).

Depending on what sort of concrete structure is present in the substrate, it is subsequently possible to perform customary retrograde well processes, filling processes, patterning processes, etc., for the purpose of forming a semiconductor component structure.

FIG. 2 shows a diagrammatic illustration of different implantation profiles for use in the method according to the invention, that is to say the concentration of the implanted ions as a function of the ratio of penetration depth x to thickness d of the oxide layer 20 for the three implantations I1, I2, and I3.

The distribution shown in FIG. 2 would result, for example in the case of the structure of FIGS. 1a–c, in a contact region 25 being formed which is continuous through the oxide layer as far as the semiconductor substrate 10 and with side walls that are stepped (three steps).

In general, the selective implantation can be carried out at different angles and/or energies and/or doses, in order to realize etching structures that are configured as desired in the oxide layer 20.

Referring now to FIGS. 3a–g, there are shown different process stages of a second embodiment of the novel method for fabricating a semiconductor component containing the semiconductor insulation layer, in the form of a field-effect transistor inverter.

In brief overview, FIGS. 3a–g add various references not previously described: section lines are designated A–A'; B–B'; C–C'. There is also provided a first mask 300, a second mask 310, a third mask 311 and 312, a conductive layer of polysilicon 400, and a gate insulation layer 500 (for example oxide). Reference numerals 540a and 540b designate a respective channel well zone; 600a, 650a designate a respective source zone; 600b, 650b designate a respective drain zone; 700a–d designate a mask for patterning the conductive layer 400; 800 designates a spacer insulation of the conductive layer (gate contact insulation); and 900a,b designate a respective source/drain contact.

The method example shown in FIGS. 3a–g involves a method for fabricating a field-effect transistor structure which uses the above-mentioned semiconductor insulation layer.

The first step is the provision of the Si semiconductor substrate 10 and then whole-area application of the oxide layer 20 to the semiconductor substrate 10 with a predetermined thickness d, for example 5–10 μm.

There follows a step of forming a first mask 300 on the semiconductor substrate 10 with a dumbbell-shaped configuration. Selective implantation of boron impurity ions into the dumbbell zone in accordance with the first mask 300 is then carried out, the implantation profile being selected in accordance with an etching zone situated on the surface and having a smaller thickness, namely d/2, than the thickness d of the oxide layer 20.

A thin oxide having a thickness d/2 is then formed in the corresponding zone by selective etching of the oxide layer 20 in the dumbbell zone in accordance with the mask 300.

This is followed by the step of forming a first mask 310 on the semiconductor substrate 10 with square openings in the dumbbell plates. Selective implantation of boron impurity ions into the dumbbell zone in accordance with the first mask 300 is then carried out, the implantation profile being selected in accordance with an etching zone which is continuous as far as the semiconductor substrate 10 and has the same thickness, namely d, as the thickness d of the oxide layer 20.

The oxide is then completely removed in the corresponding region by selective etching of the oxide layer 20 in the dumbbell zone in accordance with the mask 300.

This produces the structure shown in FIGS. 3a–c, FIGS. 3b and 3c being sections along the lines A–A' and B–B', respectively, of FIG. 3a.

Figure 3E:
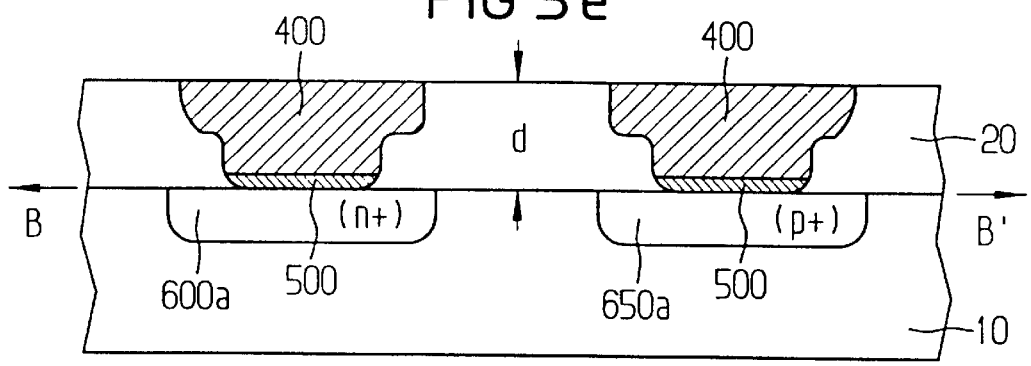
FIG. 3e is a section corresponding to FIG. 3c in a later process stadium.

As shown in FIGS. 3d and 3e, which correspond to FIGS. 3b and 3c in a later process stage, the method furthermore effects the formation of a respective p-type and n-type field-effect transistor with a $p^-$-type channel well zone 540a and an $n^-$-type channel well zone 540b in the respective square zone in accordance with a third mask 311, 312, a superior gate insulator layer 500 and $n+/p^+$-type source and drain zones 600a,b and 650a,b, respectively, in the adjoining region of the semiconductor substrate 10. This is done by known implantation processes and/or retrograde well processes.

The method then effects whole-area application of the conductive layer 400 of polysilicon to the resulting structure and chemical mechanical polishing of the conductive layer 400 to essentially the thickness d of the oxide layer 20.

This produces a structure of two mutually adjacent field-effect transistors. The conductive layer 400 of polysilicon, which runs across the dumbbell web (oxide thickness d/2), connects the two gate terminals of the field-effect transistors.

Figure 3F:
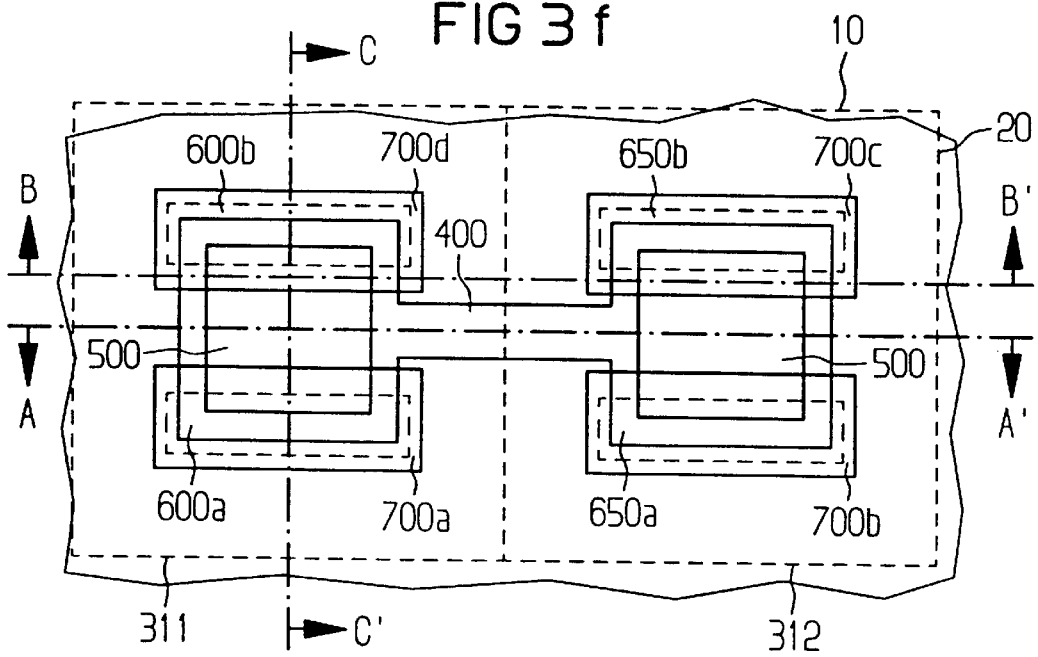
FIG. 3f is a plan view onto the semiconductor component.

Subsequently, as shown in FIG. 3f, the conductive layer 400 of polysilicon is patterned by means of a further photoresist mask 700a–d, which has four rectangular openings in the region shown, in order to form the contact terminals to the $n^+/p^+$-type source and drain zones 600a,b and 650a,b, respectively.

Figure 3G:
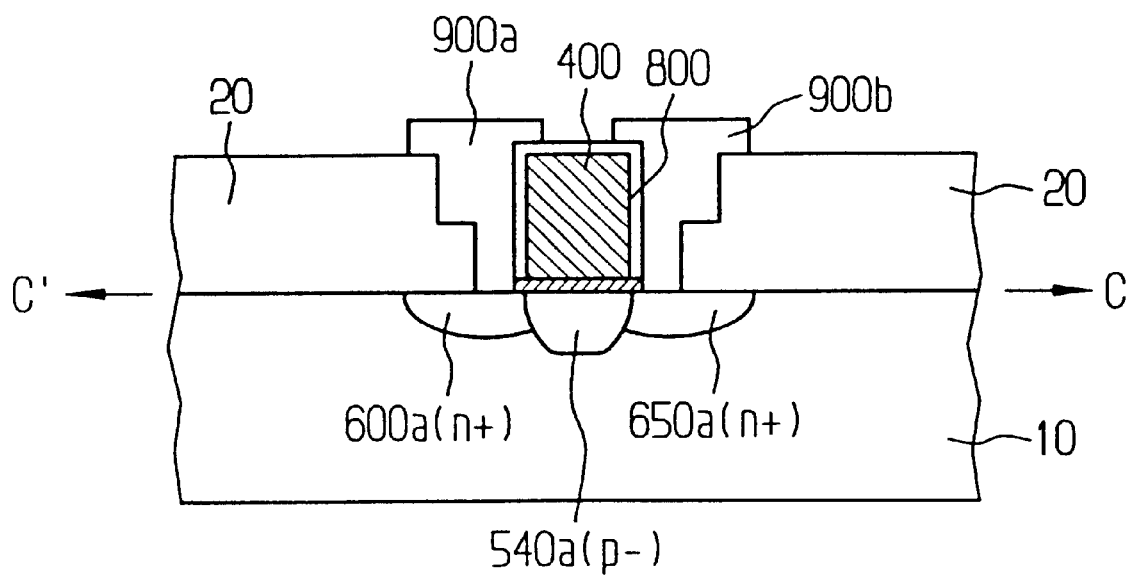
FIG. 3g is a diagrammatic sectional view taken along the line C–C' in FIG. 3f.

Finally, as shown in FIG. 3g, the gate contacts made of the polysilicon 400 are insulated by a customary spacer insulation and the source/drain contacts 900a,b are formed by means of polysilicon filling and patterning. The further process steps, such as, for instance, the deposition of a further insulator layer and metal layer and the patterning thereof, are standard and need not be explained any further here.

Although this is not shown in FIG. 3g, the conductive layer 400 must be siliconized on its surface (dual gate technology) or the gate polysilicon must be concomitantly phosphorusdoped in order to obtain a low-resistance electrical connection.

Although the present invention has been described using preferred exemplary embodiments above, it is not restricted to these but rather can be modified in diverse ways.

Although boron was implanted in the above examples, the implantation can also be carried out with any other ions that bring about the desired bond weakening or strengthening. The selection of the type of ions depends, in particular, on the available etching processes and the substrate doping. If appropriate, care should be taken to ensure that the substrate is not attacked by etching.

In particular, the source/drain contacts 900$a,b$ may also be formed by a metal filling (for example tungsten) and planarization. A further alternative consists in filling the openings with oxide and a special contact hole process of the kind which is customary in planar technology.

It is also possible to fabricate the drain/source regions by outdiffusion from the source/drain contacts 900$a,b$, if the latter are correspondingly doped. This creates highly planar drain/source regions.

Instead of using the above-mentioned second mask, it is possible to proceed further using the same mask, if, after the etching (with resist) the resist is allowed to flow further.

I claim:

1. A method of fabricating a semiconductor insulation layer, which comprises the following steps:
   providing a semiconductor substrate;
   forming an insulation layer with a given thickness on the semiconductor substrate;
   selectively implanting impurity ions into a given zone of the insulation layer;
   selectively etching the insulation layer and patterning the insulation layer in correspondence with the given zone of selectively implanted impurity ions; and
   selecting an implantation profile in accordance with an etching zone having the same thickness as a given thickness of the insulation layer.

2. The method according to claim 1, wherein the providing step comprises providing a silicon semiconductor substrate.

3. The method according to claim 2, wherein the forming step comprises forming a silicon dioxide layer.

4. The method according to claim 3, wherein the forming step comprises forming a thermal oxide layer.

5. The method according to claim 3, wherein the forming step comprises forming a layer of thermal oxide on the semiconductor substrate and a layer of non-thermal oxide on the layer of thermal oxide.

6. The method according to claim 5, wherein the layer of non-thermal oxide is an oxide selected from the group consisting of TEOS and LTO.

7. The method according to claim 1, which comprises providing at least one mask for the selectively implanting step.

8. The method according to claim 7, wherein the at least one mask is a photoresist mask.

9. The method according to claim 1, wherein the selectively implanting step comprises selectively adjusting an implanting parameter selected from the group consisting of an implantation angle, an implantation energy, and an implantation dose.

10. The method according to claim 1, which comprises adjusting the selective implantation and etching such that the insulation layer in the given zone is removed by the etching.

11. The method according to claim 1, which comprises adjusting the selective implantation and etching such that the insulation layer in the given zone is not removed by the etching.

12. The method according to claim 1, wherein the selective implantation and etching steps comprise forming a contact region, which is continuous through the insulation layer as far as the semiconductor substrate.

13. The method according to claim 1, wherein the implanting step comprises implanting at least one element selected from the group consisting of Ar, N, O, B, As, and P, and wherein a concentration of the impurities defines an etching rate in the respective zone.

14. The method according to claim 1, wherein the forming step comprises forming the insulation layer with a process selected from the group of region-by-region formation and whole-area layer formation.

* * * * *